United States Patent
Shen (10) Patent No.: US 8,674,772 B2
(45) Date of Patent: Mar. 18, 2014

(54) OSCILLATING SIGNAL GENERATOR UTILIZED IN PHASE-LOCKED LOOP AND METHOD FOR CONTROLLING THE OSCILLATING SIGNAL GENERATOR

(75) Inventor: Chih-Hsien Shen, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 23 days.

(21) Appl. No.: 13/430,664

(22) Filed: Mar. 26, 2012

(65) Prior Publication Data

US 2012/0249249 A1  Oct. 4, 2012

Related U.S. Application Data

(60) Provisional application No. 61/470,725, filed on Apr. 1, 2011.

(51) Int. Cl.
  *H03L 7/00* (2006.01)
(52) U.S. Cl.
  USPC ............ 331/16; 331/17; 331/117 R; 331/167; 331/176; 331/177 R
(58) Field of Classification Search
  USPC ..... 331/16, 17, 36 C, 117 R, 167, 176, 177 R
  See application file for complete search history.

(56) References Cited

U.S. PATENT DOCUMENTS

| | | | |
|---|---|---|---|
| 4,978,930 A | 12/1990 | Suter | |
| 5,912,595 A | 6/1999 | Ma | |
| 7,116,183 B2 | 10/2006 | Wu | |
| 7,463,097 B2 | 12/2008 | Costa | |
| 7,471,160 B2 * | 12/2008 | Feng et al. | 331/17 |
| 2009/0231044 A1 * | 9/2009 | Iwaida et al. | 331/10 |
| 2009/0261917 A1 * | 10/2009 | Taghivand et al. | 331/36 C |
| 2009/0289724 A1 * | 11/2009 | Hu et al. | 331/16 |
| 2012/0081188 A1 * | 4/2012 | Liu et al. | 331/179 |

OTHER PUBLICATIONS

Diarmuid Collins, Aidan Keady, Ronan Farrell, ISSC, "Fast Frequency Calibration of VCO's in Phase-Locked Loops", Jun. 23-24, 2010.

* cited by examiner

*Primary Examiner* — Joseph Chang
*Assistant Examiner* — Jeffrey Shin
(74) *Attorney, Agent, or Firm* — Winston Hsu; Scott Margo (57) ABSTRACT

An oscillating signal generator utilized in a phase-locked loop (PLL) includes: an oscillating circuit arranged to generate an oscillating signal according to at least a first control signal; and a control circuit, arranged to adjust the first control signal according to a temperature; and the first control signal is tuned between a first boundary and a second boundary, and when the temperature is closer to a first temperature boundary than a second temperature boundary, and the control circuit is arranged to make the first control signal to be closer to the first boundary than the second boundary such that the oscillating circuit outputs the oscillating signal of a predetermined frequency in a locked mode of the PLL.

11 Claims, 10 Drawing Sheets

OSCILLATING SIGNAL GENERATOR UTILIZED IN PHASE-LOCKED LOOP AND METHOD FOR CONTROLLING THE OSCILLATING SIGNAL GENERATOR

CROSS REFERENCE TO RELATED APPLICATIONS

This application claims the benefit of U.S. Provisional Application No. 61/470,725, which was filed on Jan. 4, 2011 and is included herein by reference.

BACKGROUND

The present invention relates to an oscillating signal generator utilized in a phase-locked loop and method for controlling the oscillating signal generator, and more particularly to a mechanism to compensate frequency variation of an oscillating circuit due to the temperature variation, and method thereof.

In a voltage-controlled oscillator (VCO), such as an LC (Inductor-capacitor)-tank VCO, the oscillation frequency of the oscillating output signal is very sensitive to the temperature. More specifically, each temperature-sensitive element in the VCO may react differently with respect to the temperature. Some elements may have positive temperature coefficients and some may be negative. Furthermore, the temperature-sensitive elements may be process dependent. Therefore, providing a temperature compensation method to model and compensate the oscillation frequency of the VCO with respect to the temperature can be a very difficult job, especially in a high frequency system. Moreover, in some continuous receiving or transmitting systems, the phase-locked loop (PLL) must continuously lock a predetermined input clock during the operation mode, thus it is difficult to calibrate the variation of the oscillation frequency of the VCO under the operation mode since it might cause the PLL fails to lock the predetermined input clock. Therefore, providing an innovated method to compensate the frequency variation of the VCO due to the temperature is a significant concern in this field.

SUMMARY

One of the objectives of the present embodiment is to provide a mechanism to compensate frequency variation of an oscillating circuit due to the temperature variation.

According to a first embodiment of the present invention, an oscillating signal generator utilized in a phase-locked loop (PLL) is disclosed. The oscillating signal generator comprises an oscillating circuit and a control circuit. The oscillating circuit is arranged to generate an oscillating signal according to at least a first control signal. The control circuit is arranged to adjust the first control signal according to a temperature, wherein the first control signal is tuned between a first boundary and a second boundary, and when the temperature is closer to a first temperature boundary than a second temperature boundary, the control circuit is arranged to make the first control signal to be closer to the first boundary than the second boundary such that the oscillating circuit outputs the oscillating signal of a predetermined frequency in a locked mode of the PLL.

According to a second embodiment of the present invention, a method for controlling an oscillating signal generator utilized in a phase-locked loop (PLL) is disclosed. The method comprises: arranging an oscillating circuit to generate an oscillating signal according to at least a first control signal, wherein the first control signal is tuned between a first boundary and a second boundary; and when a temperature is closer to a first temperature boundary than a second temperature boundary, controlling the first control signal to be closer to the first boundary than the second boundary such that the oscillating circuit outputs the oscillating signal of a predetermined frequency in a locked mode of the PLL.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
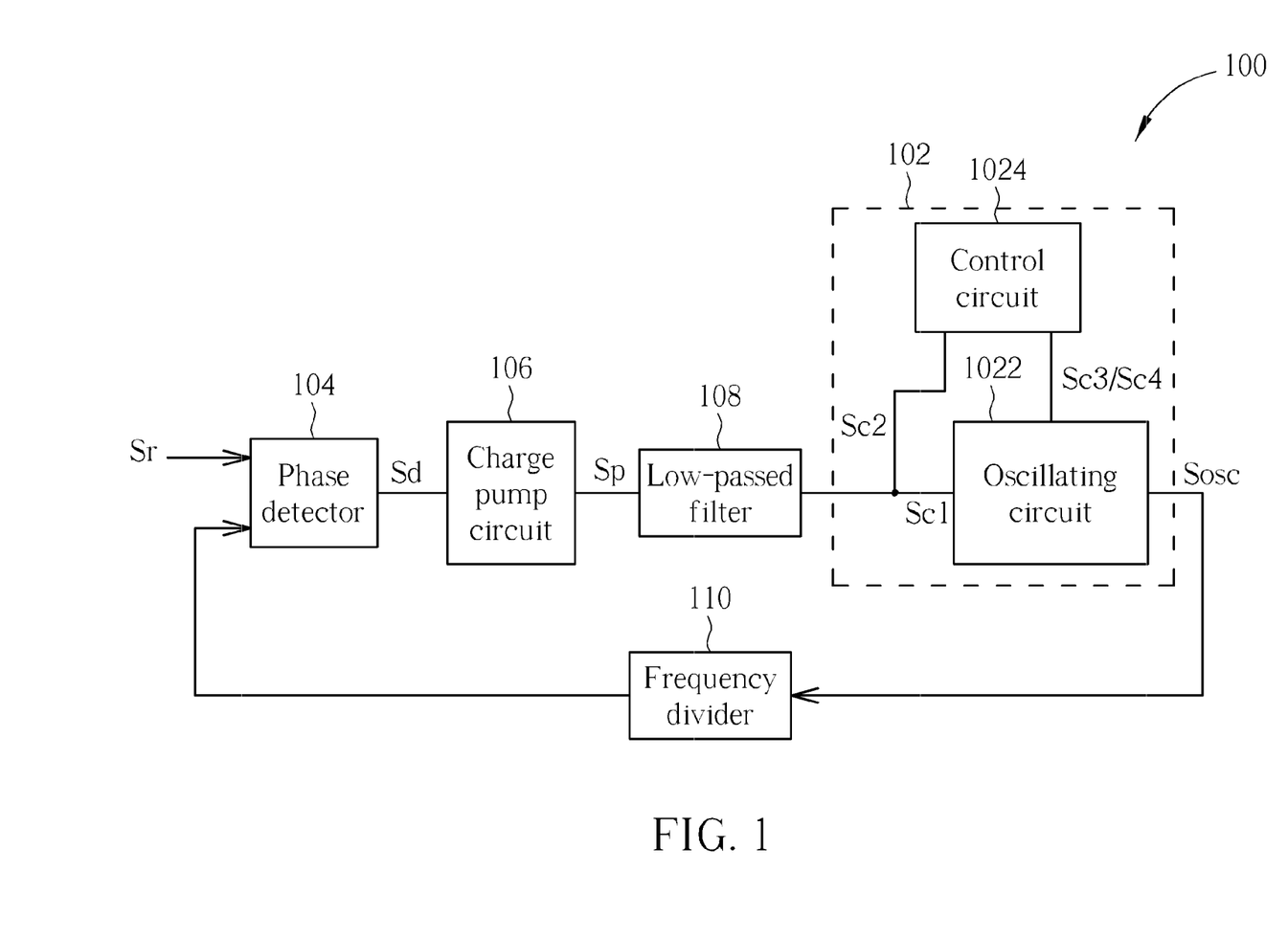
FIG. 1 is a diagram illustrating a phase-locked loop according to an embodiment of the present invention.

Please refer to FIG. 1. FIG. 1 is a diagram illustrating a phase-locked loop (PLL) 100 according to an embodiment of the present invention. The PLL 100 comprises an oscillating signal generator 102, a phase detector 104, a charge pump circuit 106, a low-passed filter 108, and a frequency divider 110, wherein the arrangement of the oscillating signal generator 102, the phase detector 104, the charge pump circuit 106, the low-passed filter 108, and the frequency divider 110 are shown in FIG. 1. The phase detector 104 is arranged to detect the phase difference between a reference oscillating signal Sr and a feedback signal Sf to generate a detected output signal Sd. The charge pump circuit 106 is arranged to generate a charge pump signal Sp according to the detected output signal Sd. The low-passed filter 108 is arranged to perform a low-passed filtering upon the charge pump signal Sp to generate a first control signal Sc1 during a locked mode of the PLL 100. The oscillating signal generator 102 is arranged to generate an oscillating signal Sosc according to at least a first control signal Sc1. The frequency divider 1030 performs a frequency dividing operation upon the output oscillating signal Sosc to generate the feedback signal Sf.

The oscillating signal generator 102 comprises an oscillating circuit 1022 and a control circuit 1024. The control circuit 1024 is arranged to generate a second control signal Sc2, a third control signal Sc3, and a fourth control signal Sc4. It should be noted that the oscillating signal Sosc is outputted from a first output terminal No1 and a second output terminal Not of the oscillating circuit 1022. The oscillating circuit 1022 is arranged to generate the oscillating signal Sosc according to the second control signal Sc2 and the third control signal Sc3 during a calibration mode of the PLL 100, and arranged to generate the oscillating signal Sosc according to the first control signal Sc1 and the fourth control signal Sc4 during a locked mode of the PLL 100.

More specifically, during the calibration mode, the third control signal Sc3 is used to control the oscillating circuit 1022 to generate the oscillating signal Sosc corresponding to a first sub-band range (i.e., the normal sub-band range), and the second control signal Sc2 is used to control the oscillating circuit 1022 to generate the oscillating signal Sosc having the predetermined frequency on the normal sub-band range. During the locked mode, the fourth control signal Sc4 is used to control the oscillating circuit 1022 to generate the oscillating signal Sosc corresponding to a second sub-band range (i.e., an offset sub-band range other than the normal sub-band range), and the first control signal Sc1 is used to control the oscillating circuit 1022 to generate the oscillating signal Sosc having the predetermined frequency on the offset sub-band range. Therefore, the first control signal Sc1 and the second control signal Sc2 may be continuous voltage signals (or equivalently continuous while the oscillating circuit 1022 is implemented by a digitally-controlled oscillator) used for locking the oscillating circuit 1022 to generate the oscillating signal Sosc in the locked mode and the calibration mode respectively. The third control signal Sc3 and the fourth control signal Sc4 may be discrete sub-band digitized signals used for switching the oscillating circuit 1022 to oscillate in the first sub-band range during the calibration mode and in the second sub-band range during the locked mode respectively.

According to the exemplary embodiment, the first control signal Sc1 is locked by the PLL 100 and is tuned between a first boundary and a second boundary, and when the temperature is closer to a first temperature boundary (e.g., the lowest acceptable temperature of the system) than a second temperature boundary (e.g., the highest acceptable temperature of the system), the control circuit 1024 is arranged to make the first control signal Sc1 to be closer to the first boundary than the second boundary such that the oscillating circuit 1022 outputs the oscillating signal Sosc of the predetermined frequency in the locked mode of the PLL 100. It should be noted that, during the locked mode, the second control signal Sc2 is disconnected from the terminal Nt of the oscillating circuit 1022.

Figure 2:
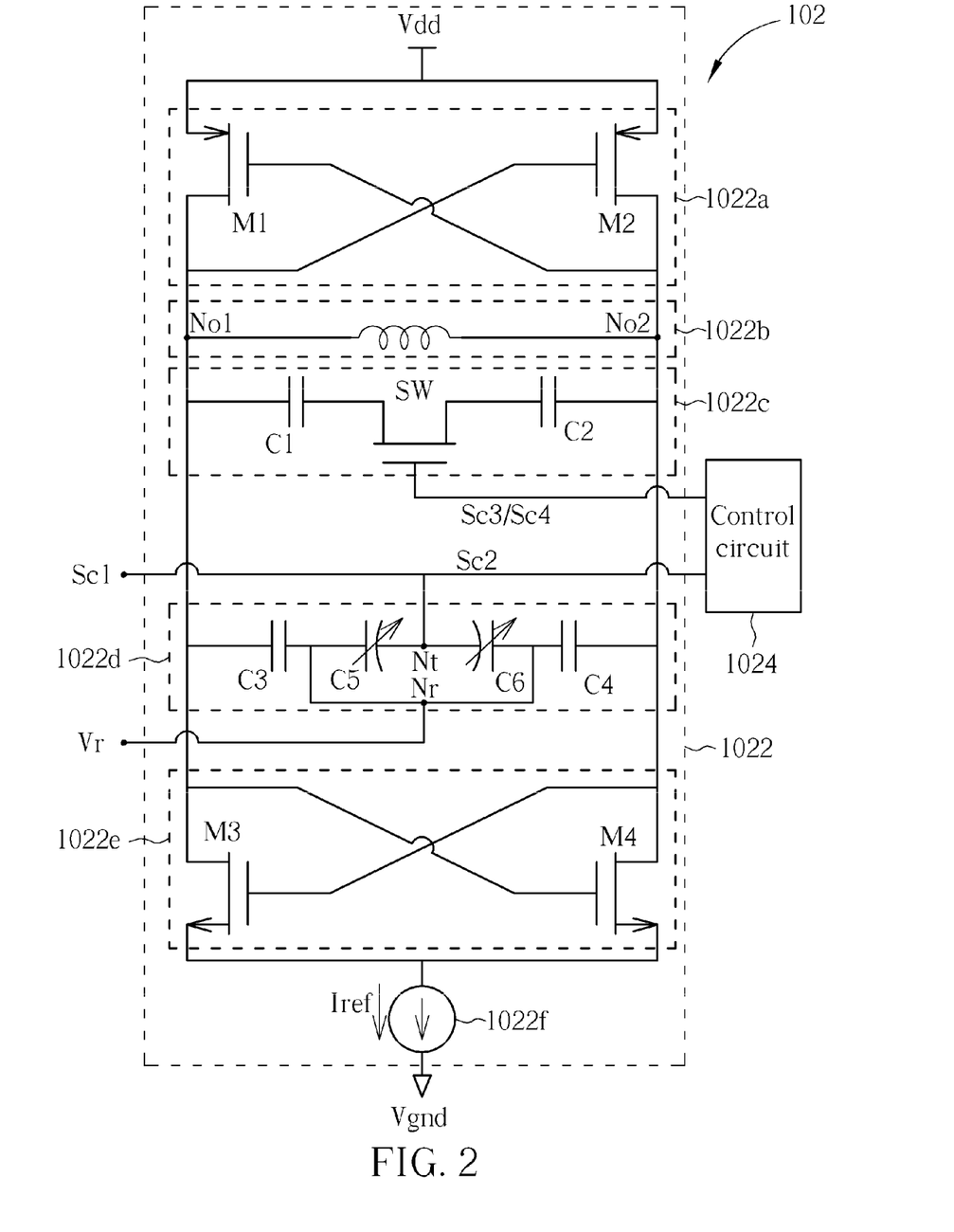
FIG. 2 is a diagram illustrating an oscillating signal generator according to an embodiment of the present invention.

Please refer to FIG. 2. FIG. 2 is a diagram illustrating the oscillating signal generator 102 according to an embodiment of the present invention. The oscillating signal generator 102 comprises an oscillating circuit 1022 and a control circuit 1024. In this exemplary embodiment, the oscillating circuit 1022 is a Inductor-capacitor-tank (LC-tank) voltage-controlled oscillator (VCO), but this is not the limitation of the present embodiment. The oscillating circuit 1022 may also be a digitally-controlled oscillator (DCO). The oscillating circuit 1022 comprises a first cross-coupled driving cell 1022a, an inductive device 1022b, a switching-capacitor array 1022c, a varactor 1022d, a second cross-coupled driving cell 1022e, and a biasing current source 1022f. The first cross-coupled driving cell 1022a comprises two cross-coupled P-type transistors M1, M2 coupled to the supply voltage Vdd, the first output terminal No1 and the second output terminal No2. The switching-capacitor array 1022c is briefly illustrated by two capacitors C1, C2, and a switch SW, wherein the capacitor C1 is coupled between the first output terminal No1 and the switch SW, and the capacitor C2 is coupled between the second output terminal Not and the switch SW. The switch SW is controlled by the third control signal Sc3 in the calibration mode and controlled by the fourth control signal Sc4 in the locked mode. The third control signal Sc3 and the fourth control signal Sc4 may be digital control signal having a plurality of bits. The capacitors C1, C2 may each comprise a plurality of capacitive elements arranged to selectively adjust the sub-band range of the oscillating circuit 1022 according to the digital control signals during the calibration mode and the locked mode.

The varactor 1022d is briefly illustrated by two capacitors C3, C4, and two adjustable capacitors C5, C6, wherein a first terminal of the capacitor C3 is coupled to the first output terminal No1, a second terminal of the capacitor C3 is coupled to a first terminal of the adjustable capacitor C5, a first terminal of the capacitor C4 is coupled to the second output terminal No2, a second terminal of the capacitor C4 is coupled to a first terminal of the adjustable capacitor C6, and a second terminal of the adjustable capacitor C6 is coupled to the second terminal of the adjustable capacitor C5. In addition, the second terminal of the capacitor C3 and the second terminal of the capacitor C4 (i.e., Nr) are coupled to a reference voltage Vr, and the second terminal of the adjustable capacitor C6 and the second terminal of the adjustable capacitor C5 (i.e., Nt) are controlled by the first control signal Sc1 in the locked mode and controlled by the second control signal Sc2 in the calibration mode of the PLL 100, wherein the reference voltage Vr is a fixed voltage level. The second cross-coupled driving cell 1022e comprises two cross-coupled N-type transistors M3, M4 coupled to the first output terminal No1, the second output terminal Not and the biasing current source 1022f. The biasing current source 1022f is coupled between the second cross-coupled driving cell 1022e and the ground voltage Vgnd for providing a reference current Iref for the oscillating circuit 1022.

Figure 3A:
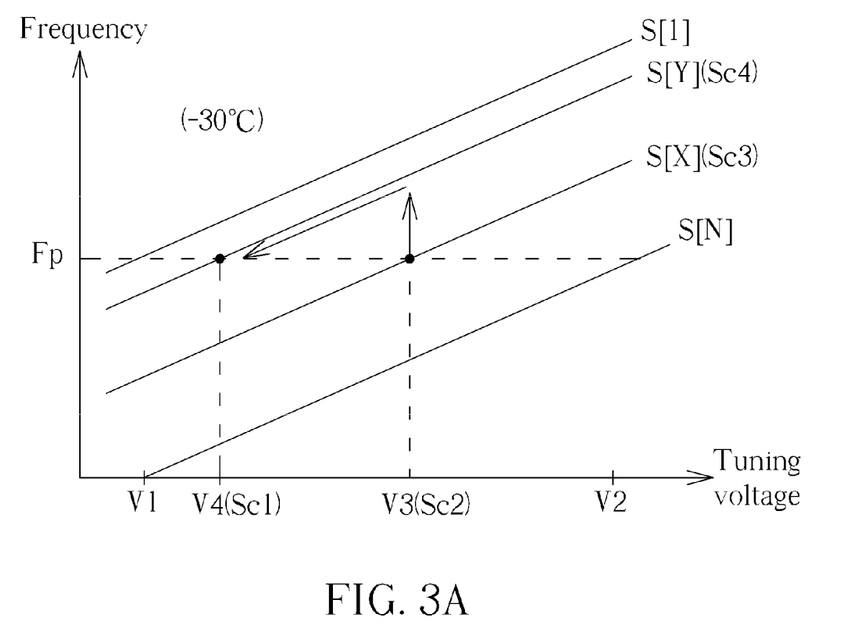
FIG. 3A is a diagram illustrating a plurality of sub-band ranges of the oscillating circuit corresponding to a first temperature according to an embodiment of the present invention.
Figure 3B:
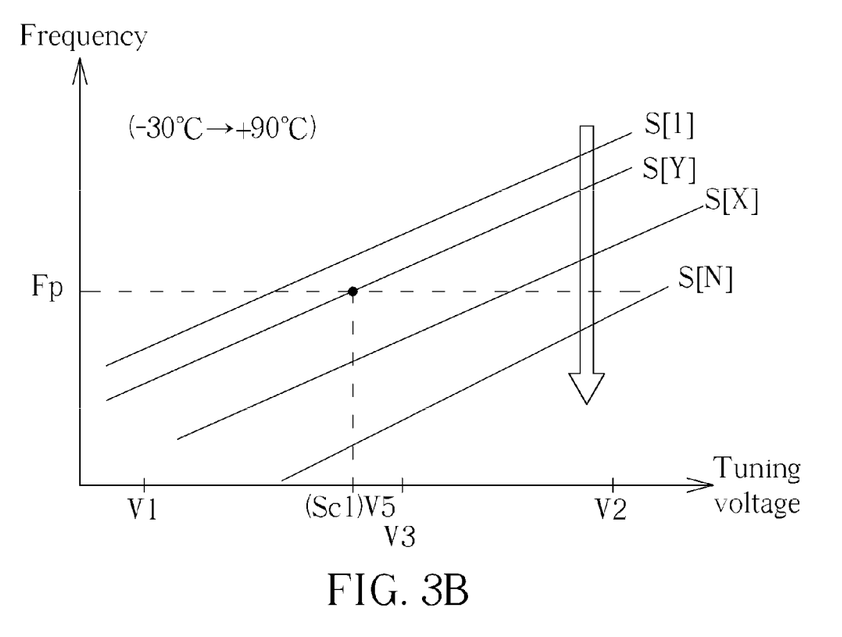
FIG. 3B is a diagram illustrating a plurality of sub-band ranges of the oscillating circuit corresponding to a second temperature according to an embodiment of the present invention.

Please refer to FIG. 3A and FIG. 3B. FIG. 3A is a diagram illustrating a plurality of sub-band ranges S[1]-S[N] of the oscillating circuit 1022 corresponding to a first temperature according to an embodiment of the present invention, wherein N is integer number. FIG. 3B is a diagram illustrating the plurality of sub-band ranges S[1]-S[N] of the oscillating circuit 1022 corresponding to a second temperature according to an embodiment of the present invention. In this exemplary embodiment, the first temperature may be a low temperature (e.g., −30° C.), and the second temperature may be a high temperature (e.g., 90° C.). It can be seen that the plurality of sub-band ranges S[1]-S[N] are shifted from upper to lower in the figure when the ambient temperature changes from the low temperature to the high temperature. It should be noted that, when the PLL 100 is implemented in a continuous receiving or transmitting system, such as Wideband Code Division Multiple Access (WCDMA) system, Wireless Fidelity (Wi-Fi) system, or Global Positioning System (GPS) system, the PLL 100 must always keep the frequency locked when the system is under the operation. Therefore, the tuning voltage of the oscillating circuit 1022 should change to higher voltage from the lower voltage when the ambient temperature changes from the low temperature to the high temperature if the PLL 100 must always keep the frequency locked. However, when the variation of the ambient temperature is large, the tuning range of the tuning voltage may not enough for keeping the frequency locked and consequently causing the frequency of the oscillating signal Sosc deviate from the predetermined oscillating frequency. Therefore, according to the first exemplary embodiment, the control circuit 1024 is arranged to offset the sub-band range of the oscillating circuit 1022 into the offset sub-band range other than the normal sub-band range before the system is utilized to receive or transmit the wireless signal.

In other words, before the system is utilized to receive or transmit the wireless signal, the PLL 100 should perform the calibration mode and the locked mode. The third control signal Sc3 is used to decide which sub-band range among the plurality of sub-band ranges S[1]-S[N] is being used by the oscillating circuit 1022 in the calibration mode, and the fourth control signal Sc4 is used to decide which sub-band range among the plurality of sub-band ranges S[1]-S[N] is being used by the oscillating circuit 1022 in the locked mode. The second control signal Sc2 is used to control the oscillating circuit 1022 to generate the oscillating signal Sosc having the predetermined frequency on the selected sub-band range in the calibration mode, and the first control signal Sc1 is used to control the oscillating circuit 1022 to generate the oscillating signal Sosc having the predetermined frequency on the selected sub-band range in the locked mode. The first control signal Sc1 and the second control signal Sc2 are tuned between the first boundary V1 and the second boundary V2, and both the first boundary V1 and the second boundary V2 are voltage boundaries.

In addition, it is assumed that the PLL 100 has to lock the oscillating frequency of the oscillating signal Sosc on a predetermined frequency Fp when the system is under the normal operation. Therefore, in the calibration mode, the control circuit 1024 will first generate the second control signal Sc2, which is substantially equals the middle position between the first boundary V1 and the second boundary V2, i.e., the middle voltage level V3 between the first boundary V1 and the second boundary V2, and then generate the third control signal Sc3 to make the oscillating circuit 1022 generate the oscillating signal Sosc having the predetermined frequency Fp by using the normal sub-band range as shown in FIG. 3A, in which the normal sub-band range is assumed to be the sub-band range S[X]. However, the normal sub-band range S[X] is obtained under the temperature of −30° C., and if the ambient temperature is changed to a normal temperature, e.g., 90° C., the second control signal Sc2 may not have enough voltage range for the PLL 100 to keep locking the oscillating frequency of the oscillating signal Sosc on the predetermined frequency Fp by using the normal sub-band range S[X].

Therefore, after the calibration mode, the control circuit 1024 refers the ambient temperature to generate the fourth control signal Sc4 for operating the oscillating circuit 1022 to use the offset sub-band range S[Y], which is offset from the normal sub-band range S[X], since the offset sub-band range S[Y] may have enough voltage range for the PLL 100 to keep locking on the predetermined frequency Fp when the ambient temperature is changed from the low temperature to the high temperature. It is noted that, in this exemplary embodiment, a thermal sensor (not shown) may further be utilized to sense the ambient temperature of the oscillating signal generator 102 for the control circuit 1024. Accordingly, when the sub-band range is adjusted to the offset sub-band range S[Y], the tuning voltage (i.e., the first control signal Sc1) of the oscillating circuit 1022 is locked to the voltage V4, which is smaller than the voltage V3, for generating the oscillating signal Sosc with the predetermined frequency Fp as shown in FIG. 3A. In other words, during the locked mode of the PLL 100, the tuning voltage (i.e., the first control signal Sc1) of the oscillating circuit 1022 is adjusted to the voltage closer to the lowest tuning voltage (i.e., the first boundary V1) when the ambient temperature closes to the lowest acceptable temperature of the system. Otherwise, the tuning voltage of the oscillating circuit 1022 is adjusted to the voltage closer to the highest tuning voltage (i.e., the second boundary V2) when the ambient temperature closes to the highest acceptable temperature of the system.

According to FIG. 3B, when the PLL 100 is under the normal operation and the temperature increases to 90° C., the tuning voltage (i.e., the first control signal Sc1) of the oscillating circuit 1022 is adjusted to the voltage V5 by the PLL 100, which substantially locates at the middle position between the first boundary V1 and the second boundary V2, to generate the oscillating signal Sosc with the predetermined frequency Fp. Accordingly, the PLL 100 is capable of locking on the predetermined frequency Fp even in the higher temperature (e.g., 300° C.) by using the offset sub-band range S[Y].

Moreover, it should be noted that, the exemplary embodiments are not limited to the above polarity and the slope of sub-band range to offset the normal sub-band range S[X]. In other words, after the calibration mode and before the locked mode, the control circuit 1024 further adjusts the third control signal into the fourth control signal by a predetermined unit step signal according to the ambient temperature. In other words, the predetermined unit step signal may be used to adjust a specific number of sub-band range(s) per temperature.

Figure 4:
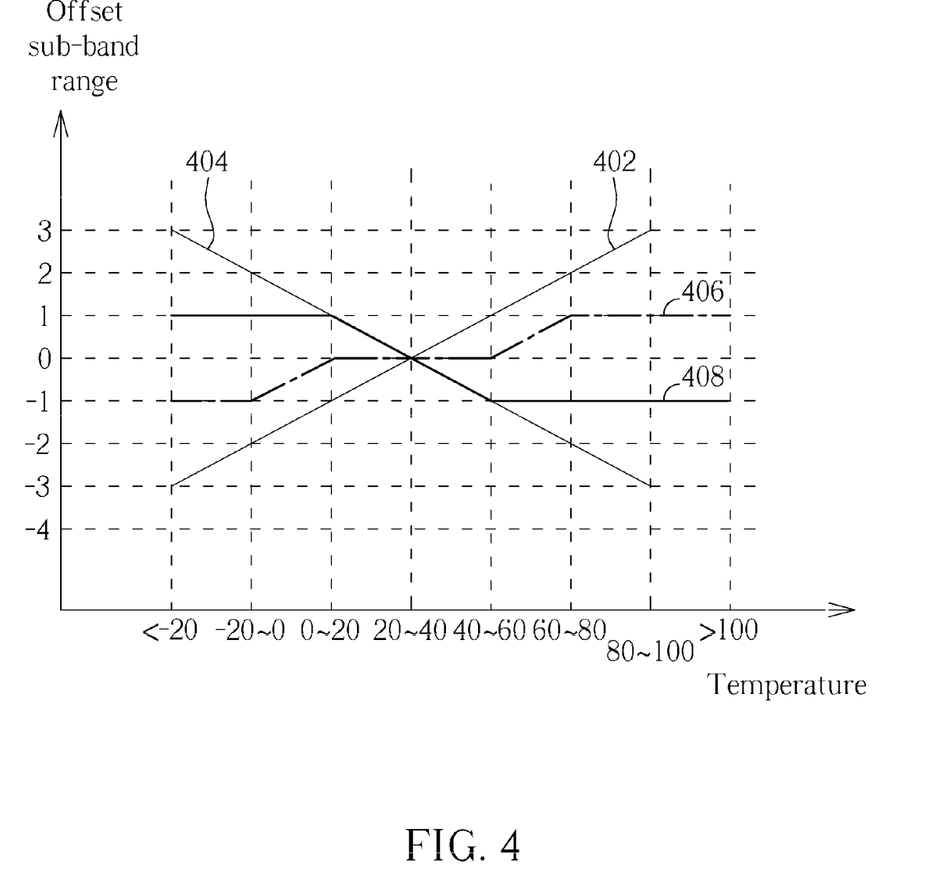
FIG. 4 is a diagram illustrating various polarities and different slopes of sub-band range utilized to offset a normal sub-band range to an offset sub-band range according to different embodiments of the present invention.

Please refer to FIG. 4. FIG. 4 is a diagram illustrating the various polarities and different slopes of sub-band range utilized to offset the normal sub-band range S[X] to the offset sub-band range S[Y] according to different embodiments of the present invention. More specifically, the fourth control signal Sc4 may be controlled to switch the sub-band range of the oscillating circuit 1022 according to the slope of the curve 402, i.e., the fourth control signal Sc4 may be controlled to increase the sub-band range of the oscillating circuit 1022 from the normal sub-band range S[X] by one sub-band range per 20° C. For example, if the ambient temperature is between 60~80° C., which means that there is 40° C. deviated from the normal 20~40° C., then the control circuit 1024 directly controls the fourth control signal Sc4 to increase two offset sub-band range of the oscillating circuit 1022 from the normal sub-band range S[X] after the calibration mode and before the locked mode. It is noted that the control circuit 1024 only performs one step to switch the oscillating circuit 1022 into the desired sub-band range before the locked mode.

Similarly, the fourth control signal Sc4 may be controlled to switch the sub-band range of the oscillating circuit 1022 according to the slope of the curve 404, or to switch the sub-band range of the oscillating circuit 1022 according to the slope of the curve 406, or to switch the sub-band range of the oscillating circuit 1022 according to the slope of the curve 408 Therefore, the polarity and the slope of sub-band range to offset the normal sub-band range S[X] for compensating the ambient temperature are programmable and the compensation coding table can be pre-stored in a memory device.

Figure 5:
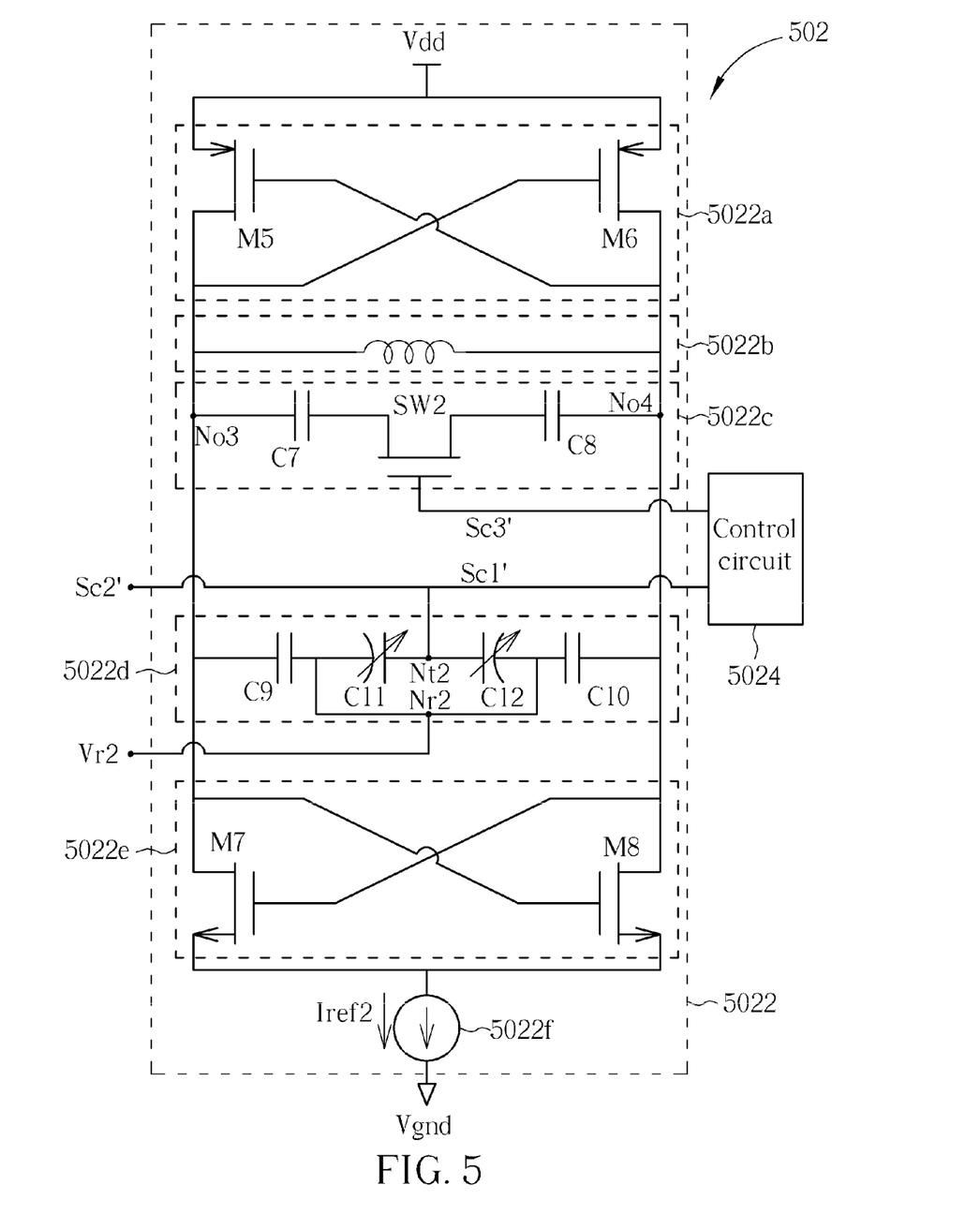
FIG. 5 is a diagram illustrating an oscillating signal generator according to the second embodiment of the present invention.

It should be noted that, in this exemplary embodiment, the control circuit 1024 refers the ambient temperature to generate the fourth control signal Sc4 to operate the oscillating circuit 1022 to use the offset sub-band range S[Y] after the calibration mode, however, this is not a limitation of the present invention. In a second exemplary embodiment, the control circuit refers the ambient temperature to offset the tuning voltage of the varactor 1022d from a substantially middle position between the first boundary V1 and the second boundary V2 into an adjusted tuning voltage to operate the oscillating circuit 1022 before the calibration mode. Please refer to FIG. 5. FIG. 5 is a diagram illustrating an oscillating signal generator 502 according to the second embodiment of the present invention. The oscillating signal generator 502 comprises an oscillating circuit 5022 and a control circuit 5024. In this exemplary embodiment, the oscillating circuit 5022 is a Inductor-capacitor-tank (LC-tank) voltage-controlled oscillator (VCO). The oscillating circuit 5022 comprises a first cross-coupled driving cell 5022a, an inductive device 5022b, a switching-capacitor array 5022c, a varactor 5022d, a second cross-coupled driving cell 5022e, and a biasing current source 5022f. The first cross-coupled driving cell 5022a comprises two cross-coupled P-type transistors M5, M6 coupled to the supply voltage Vdd, the first output terminal No3 and the second output terminal No4. The switching-capacitor array 5022c is briefly illustrated by two capacitors C7, C8, and a switch SW2, wherein the capacitor C7 is coupled between the first output terminal No3 and the switch SW2, and the capacitor C8 is coupled between the second output terminal No4 and the switch SW2. The switch SW2 is controlled by the third control signal Sc3' in the calibration mode and in the locked mode. The third control signal Sc3' may be digital control signal having a plurality of bits. The capacitors C7, C8 may each comprises a plurality of capacitive elements arranged to selectively adjust the sub-band range of the oscillating circuit 5022 according to the digital control signals during the calibration mode and the locked mode.

The varactor 5022d is briefly illustrated by two capacitors C9, C10, and two adjustable capacitors C11, C12, wherein a first terminal of the capacitor C9 is coupled to the first output terminal No3, a second terminal of the capacitor C9 is coupled to a first terminal of the adjustable capacitor C11, a first terminal of the capacitor C10 is coupled to the second output terminal No4, a second terminal of the capacitor C10 is coupled to a first terminal of the adjustable capacitor C12, and a second terminal of the adjustable capacitor C12 is coupled to the second terminal of the adjustable capacitor C11. In addition, the second terminal of the capacitor C9 and the second terminal of the capacitor C10 (i.e., Nr2) are coupled to a reference voltage Vr2, and the second terminal of the adjustable capacitor C12 and the second terminal of the adjustable capacitor C11 (i.e., Nt2) are controlled by the first control signal Sc1' before and in the calibration mode and controlled by the second control signal Sc2' in the locked mode of the PLL 100, wherein the reference voltage Vr2 is a fixed voltage level. The second cross-coupled driving cell 2022e comprises two cross-coupled N-type transistors M7, M8 coupled to the first output terminal No3, the second output terminal No4 and the biasing current source 5022f. The biasing current source 5022f is coupled between the second cross-coupled driving cell 5022e and the ground voltage Vgnd for providing a reference current Iref2 for the oscillating circuit 5022.

Figure 6A:
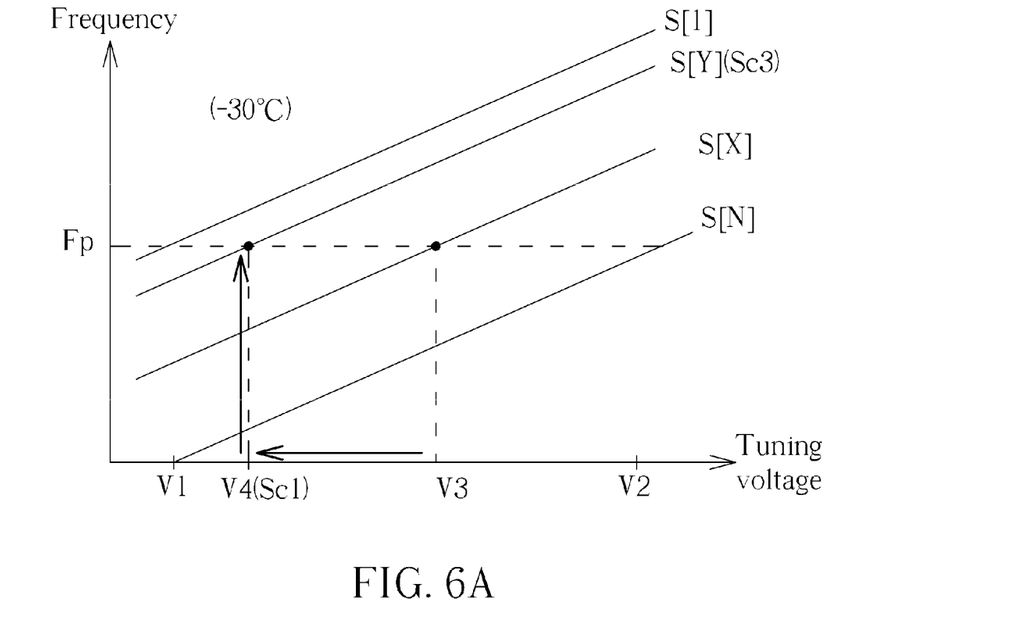
FIG. 6A is a diagram illustrating a plurality of sub-band ranges of the oscillating circuit corresponding to a first temperature according to an embodiment of the present invention.
Figure 6B:
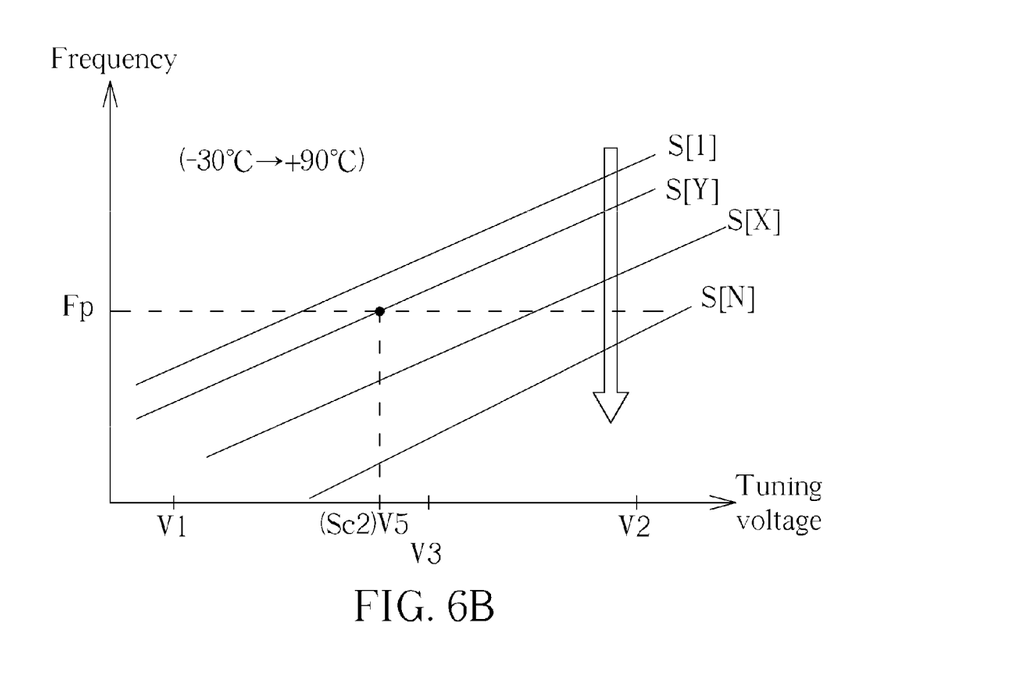
FIG. 6B is a diagram illustrating a plurality of sub-band ranges of the oscillating circuit corresponding to a second temperature according to an embodiment of the present invention.

Please refer to FIG. 6A and FIG. 6B. FIG. 6A is a diagram illustrating a plurality of sub-band ranges S[1]-S[N] of the oscillating circuit 5022 corresponding to a first temperature according to an embodiment of the present invention, wherein N is integer number. FIG. 6B is a diagram illustrating the plurality of sub-band ranges S[1]-S[N] of the oscillating circuit 5022 corresponding to a second temperature according to an embodiment of the present invention. In this exemplary embodiment, the first temperature may be a low temperature (e.g., −30° C.), and the second temperature may be a high temperature (e.g., 90° C.). The plurality of sub-band ranges S[1]-S[N] are shifted from upper to lower in the figure when the ambient temperature changes from the low temperature to the high temperature. In addition, the tuning voltage of the oscillating circuit 5022 should change to higher voltage from the lower voltage when the ambient temperature changes from the low temperature to the high temperature if the PLL 100 must always keep the frequency locked. Therefore, according to the second exemplary embodiment, the control circuit 5024 is arranged to offset the tuning voltage of the varactor 5022d from a substantially middle position (i.e., V3) between the first boundary V1 and the second boundary V2 into an offset tuning voltage (i.e., V4) before the calibration mode of the oscillating circuit 5022 according to the temperature. In other words, before the system is utilized to receive or transmit the wireless signal, the PLL 100 should perform the calibration mode and the locked mode, and before the calibration mode and the locked mode, the control circuit 5024 offsets the tuning voltage of the varactor 5022d from the substantially middle position into the offset tuning voltage (i.e., V4) according to the temperature.

According to the second exemplary embodiment, the control circuit 5024 adjusts the first control signal Sc1' to offset the tuning voltage of the varactor 5022d from the substantially middle position into the offset tuning voltage (i.e., V4) according to the temperature before the calibration mode. Then, in the calibration mode, the control circuit 5024 generates the third control signal Sc3' to the switching-capacitor array 5022c to decide which sub-band range among the plurality of sub-band ranges S[1]-S[N] is being used by the oscillating circuit 5022. Then, in the locked mode, the PLL 100 adjusts the voltage at the terminal Nt2 (i.e., the second control signal Sc2') to control the oscillating circuit 5022 to generate the oscillating signal Sosc having the predetermined frequency Fp on the selected sub-band range (i.e., S[Y]). Normally, the second control signal Sc2' is closed to the first control signal Sc1'. It should be noted that, during the locked mode, the first control signal Sc1' is disconnected from the terminal Nt2 of the oscillating circuit 5022.

More specifically, before the calibration mode of the PLL 100, the tuning voltage (i.e., the first control signal Sc1') of the oscillating circuit 5022 is adjusted to the voltage closer to the lowest tuning voltage (i.e., the first boundary V1) when the ambient temperature closes to the lowest acceptable temperature of the system. Otherwise, the tuning voltage of the oscillating circuit 5022 is adjusted to the voltage closer to the highest tuning voltage (i.e., the second boundary V2) when the ambient temperature closes to the highest acceptable temperature of the system. Therefore, after the calibration mode and the locked mode, the PLL 100 is then be able to keep locking on the predetermined frequency Fp when the ambient temperature is changed from the low temperature to the high temperature by using the offset sub-band range S[Y]. Similarly, a thermal sensor (not shown) may further be utilized to sense the ambient temperature of the oscillating signal generator 502 for the control circuit 5024.

According to FIG. 6B, when the PLL 100 is under the normal operation and the temperature increases to 90° C., the tuning voltage (i.e., the first control signal Sc2') of the oscillating circuit 1022 is adjusted to the voltage V5, which substantially locates at the middle position between the first boundary V1 and the second boundary V2, to generate the oscillating signal Sosc with the predetermined frequency Fp. Accordingly, the PLL 100 is capable of locking on the predetermined frequency Fp even in the higher temperature (e.g., 300° C.) by using the offset sub-band range S[Y].

Moreover, similar to the first embodiment, the second exemplary embodiment is not limited to the above polarity and the slope of voltage to offset the tuning voltage of the varactor 5022d. In other words, before the calibration mode and the locked mode, the control circuit 5024 further adjusts the tuning voltage of the varactor 5022d from the substantially middle position between the first boundary V1 and the second boundary V2 into an adjusted tuning voltage to operate the oscillating circuit 5022 by a predetermined unit step signal according to the ambient temperature. The predetermined unit step signal may be used to adjust a specific voltage unit per temperature. Since the implementation is similar to the implementation of the first embodiment, the detailed description is omitted here for brevity.

Figure 7:
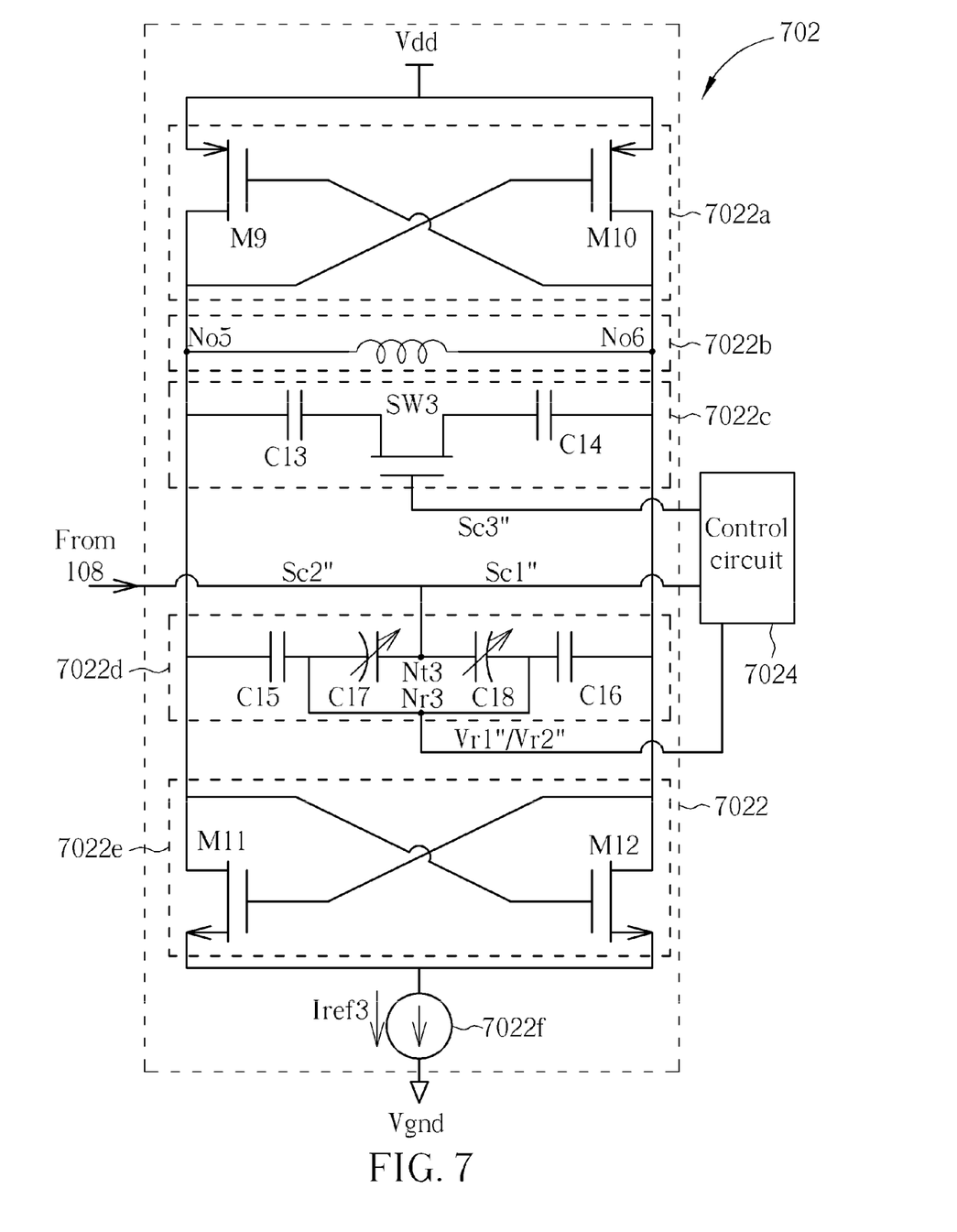
FIG. 7 is a diagram illustrating an oscillating signal generator according to the third embodiment of the present invention.

It should be noted that, in this exemplary embodiment, the control circuit 5024 refers the ambient temperature to offset the tuning voltage of the varactor 5022d from the substantially middle position between the first boundary V1 and the second boundary V2 to operate the oscillating circuit 5022 to use the offset sub-band range S[Y] before the calibration mode, however, this is not a limitation of the present invention. In a third exemplary embodiment, after the calibration mode, the control circuit refers the ambient temperature to offset the reference voltage of the varactor from an original reference voltage (e.g., a first reference voltage) to an offset reference voltage (e.g., a second reference voltage), and the tuning voltage of the varactor is kept substantially equal to the middle position between the first boundary V1 and the second boundary V2. Please refer to FIG. 7. FIG. 7 is a diagram illustrating an oscillating signal generator 702 according to the third embodiment of the present invention. The oscillating signal generator 702 comprises an oscillating circuit 7022 and a control circuit 7024. In this exemplary embodiment, the oscillating circuit 7022 is a Inductor-capacitor-tank (LC-tank) voltage-controlled oscillator (VCO). The oscillating circuit 7022 comprises a first cross-coupled driving cell 7022a, an inductive device 7022b, a switching-capacitor array 7022c, a varactor 7022d, a second cross-coupled driving cell 7022e, and a biasing current source 7022f. The first cross-coupled driving cell 7022a comprises two cross-coupled P-type transistors M9, M10 coupled to the supply voltage Vdd, the first output terminal No5 and the second output terminal No6. The switching-capacitor array 7022c is briefly illustrated by two capacitors C13, C14, and a switch SW3, wherein the capacitor C13 is coupled between the first output terminal No5 and the switch SW3, and the capacitor C14 is coupled between the second output terminal No6 and the switch SW3. The switch SW3 is controlled by the third control signal Sc3" in the calibration mode and the locked mode. The third control signal Sc3" may be digital control signal having a plurality of bits. The capacitors C13, C14 may each comprise a plurality of capacitive elements arranged to selectively adjust the sub-band range of the oscillating circuit 7022 according to the digital control signals during the calibration mode and the locked mode.

The varactor 7022d is briefly illustrated by two capacitors C15, C16, and two adjustable capacitors C17, C18, wherein a first terminal of the capacitor C15 is coupled to the first output terminal No5, a second terminal of the capacitor C15 is coupled to a first terminal of the adjustable capacitor C17, a first terminal of the capacitor C16 is coupled to the second output terminal No6, a second terminal of the capacitor C16 is coupled to a first terminal of the adjustable capacitor C18, and a second terminal of the adjustable capacitor C18 is coupled to the second terminal of the adjustable capacitor C17. In addition, the second terminal of the capacitor C15 and the second terminal of the capacitor C16 (i.e., Nr3) are coupled to the first reference voltage Vr1" in the calibration mode, and coupled to the second reference voltage Vr2" after the calibration mode. The second terminal of the adjustable capacitor C18 and the second terminal of the adjustable capacitor C17 (i.e., Nt3) are controlled by the first control signal Sc1" in the calibration mode, wherein the first control signal Sc1" substantially equals the middle position between the first boundary V1 and the second boundary V2. The terminal Nt3 is controlled by the second control signal Sc2" in the locked mode. The second cross-coupled driving cell 7022e comprises two cross-coupled N-type transistors M11, M12 coupled to the first output terminal No5, the second output terminal No6 and the biasing current source 7022f. The biasing current source 7022f is coupled between the second cross-coupled driving cell 7022e and the ground voltage Vgnd for providing a reference current Iref3 for the oscillating circuit 7022.

According to the third exemplary embodiment, in the calibration mode, the control circuit 7024 generates the first reference voltage Vr1" (i.e., the original reference voltage) at the terminal Nr3 of the varactor 7022d, and generates the first control signal Sc1" substantially equal to the middle position between the first boundary V1 and the second boundary V2 to the terminal Nt3 of the varactor 7022d for operating the varactor 7022d. In the calibration mode, the control circuit 7024 further generates the third control signal Sc3" to the switching-capacitor array 7022c to decide which sub-band range among the plurality of sub-band ranges S[1]-S[N] is being used by the oscillating circuit 7022. Then, after the calibration mode, the control circuit 7024 offsets the first reference voltage Vr1" into a second reference voltage Vr2" (i.e., the offset reference voltage) to operate the varactor 7022d according to the ambient temperature (or chip temperature) before the locked mode. It is noted that the second reference voltage Vr2" may different from the first reference voltage Vr1". Then, in the locked mode, the PLL 100 adjusts the voltage of the terminal Nt3 of the oscillating circuit 7022 to control the oscillating circuit 7022 to generate the oscillating signal Sosc having the predetermined frequency Fp on the selected sub-band range (i.e., S[Y]). It should be noted that, during the locked mode, the oscillating circuit 7022 is controlled by the second control signal Sc2" (i.e., the signal from the low-passed filter 108), and the first control signal Sc1" is disconnected from the terminal Nt3 of the oscillating circuit 7022.

It should be noted that, in the third embodiment, when the reference voltage at the terminal Nr3 of the varactor 7022d is changed, the values of the first boundary V1 and the second boundary V2 are also vary accordingly. Therefore, the voltage of the first control signal Sc1" may closer to one of the first boundary V1 and the second boundary V2 after the reference voltage at the terminal Nr3 of the varactor 7022d is changed as the voltage of the first control signal Sc1" is kept intact after the calibration mode and before the locked mode. In other words, the first control signal Sc1" is not in the middle position between the first boundary V1 and the second boundary V2 after the reference voltage at the terminal Nr3 of the varactor 7022d is changed. Since the effect is similar to the effect of the second embodiment, the detailed description is omitted here for brevity.

Accordingly, in the second embodiment, the idea of compensating the ambient temperature of the PLL 100 is to pre-adjust the capacitance of the varactor 5022d, which is controlled by the voltage drop between the tuning voltage (i.e., the first control signal Sc1' or the second control signal Sc2') and the reference voltage Vr2, by pre-adjusting the tuning voltage before the calibration mode. In the third embodiment, it employs the similar idea to compensate the ambient temperature of the PLL 100 but to adjust the first reference voltage Vr1" into the second reference voltage Vr2" of the varactor 7022 after the calibration mode. Therefore, the operation and benefits of the oscillating circuit 7022 are also similar to those disclosed by the oscillating circuit 5022, and thus the detailed description is omitted here for brevity.

Moreover, even though the above-mentioned embodiments are described by differential oscillating signal generators (e.g., the oscillating signal generator 102, the oscillating signal generator 502, or the oscillating signal generator 702), this is not a limitation of the present invention. Those skilled in art are readily to understand that the present method may also be applied in a single-ended oscillating signal generator in order to have the similar effect by appropriately modifying the single-ended oscillating signal generator. Therefore, the detailed description is omitted here for brevity.

Figure 8:
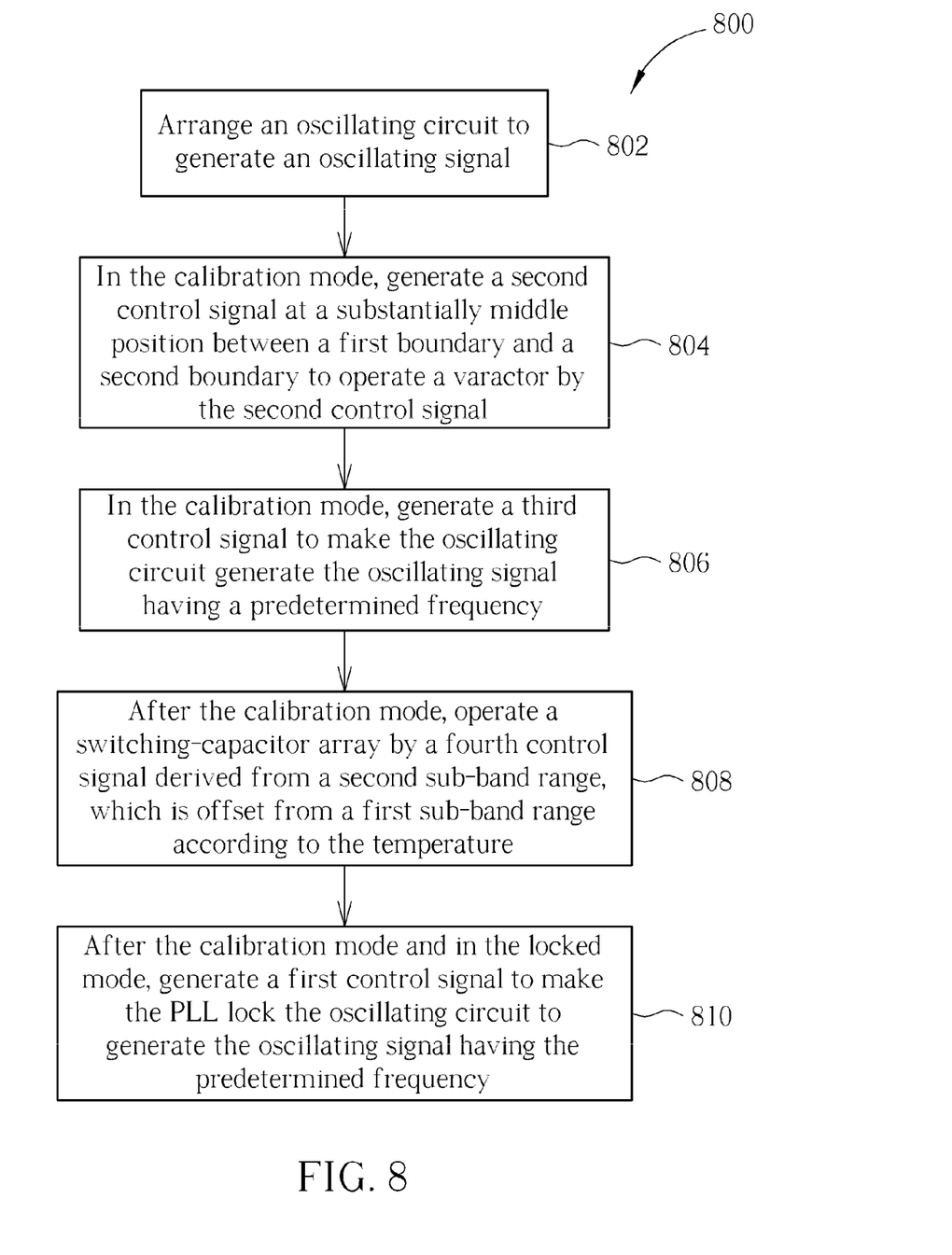
FIG. 8 is a flowchart illustrating a method for controlling an oscillating signal generator utilized in a phase-locked loop according to a fourth embodiment of the present invention.

According to the first exemplary embodiment, the operation of the oscillating signal generator 102 to compensate the effect of the ambient temperature may be briefly illustrated by the steps in FIG. 8. FIG. 8 is a flowchart illustrating a method 800 for controlling an oscillating signal generator utilized in a phase-locked loop (PLL) circuit according to a fourth embodiment of the present invention. In the following description of this exemplary embodiment, the PLL circuit may refer to the PLL 100, and the oscillating signal generator may refer to the oscillating signal generator 102 for brevity. In addition, provided that substantially the same result is achieved, the steps of the flowchart shown in FIG. 8 need not be in the exact order shown and need not be contiguous, that is, other steps can be intermediate. The method comprises:

Step 802: Arrange the oscillating circuit 1022 to generate the oscillating signal Sosc;

Step 804: In the calibration mode, generate the second control signal Sc2 at a substantially middle position between the first boundary V1 and the second boundary V2 to operate the varactor 1022d by the second control signal Sc2;

Step 806: In the calibration mode, generate the third control signal Sc3 to make the oscillating circuit 1022 generate the oscillating signal Sosc having the predetermined frequency Fp, wherein the third control signal Sc3 represents the first sub-band range S[X];

Step 808: After the calibration mode, operate the switching-capacitor array 1022c by the fourth control signal Sc4 derived from the second sub-band range S[Y], which is offset from the first sub-band range S[X] according to the temperature; and Step 810: After the calibration mode and in the locked mode, generate the first control signal Sc1 to make the PLL 100 lock the oscillating circuit 1022 to generate the oscillating signal Sosc having the predetermined frequency Fp.

Figure 9:
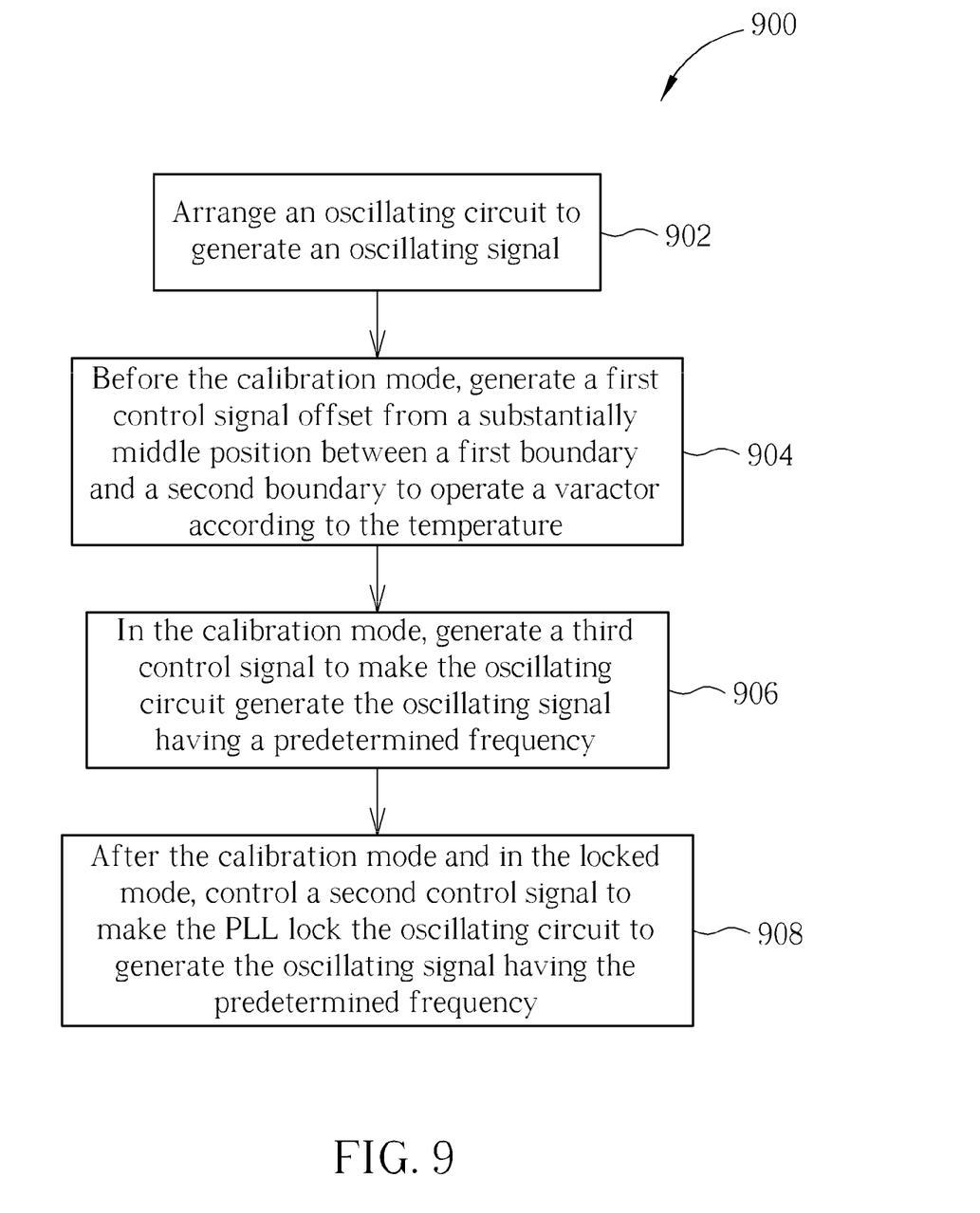
FIG. 9 is a flowchart illustrating a method for controlling an oscillating signal generator utilized in a phase-locked loop according to a fifth embodiment of the present invention.

According to the second exemplary embodiment, the operation of the oscillating signal generator 502 to compensate the effect of the ambient temperature may be briefly illustrated by the steps in FIG. 9. FIG. 9 is a flowchart illustrating a method 900 for controlling an oscillating signal generator utilized in a phase-locked loop (PLL) circuit according to a fifth embodiment of the present invention. In the following description of this exemplary embodiment, the PLL circuit may refer to the PLL 100, and the oscillating signal generator may refer to the oscillating signal generator 502 for brevity. In addition, provided that substantially the same result is achieved, the steps of the flowchart shown in FIG. 9 need not be in the exact order shown and need not be contiguous, that is, other steps can be intermediate. The method comprises:

Step 902: Arrange the oscillating circuit 5022 to generate the oscillating signal Sosc;

Step 904: Before the calibration mode, generate the first control signal Sc1' offset from a substantially middle position between the first boundary V1 and the second boundary V2 to operate the varactor 5022d according to the temperature;

Step 906: In the calibration mode, generate the third control signal Sc3' to make the oscillating circuit 5022 generate the oscillating signal Sosc having the predetermined frequency Fp, wherein the third control signal Sc3' represents the second sub-band range S[Y];

Step 908: After the calibration mode and in the locked mode, control the second control signal Sc2' to make the PLL 100 lock the oscillating circuit 5022 to generate the oscillating signal Sosc having the predetermined frequency Fp.

Figure 10:
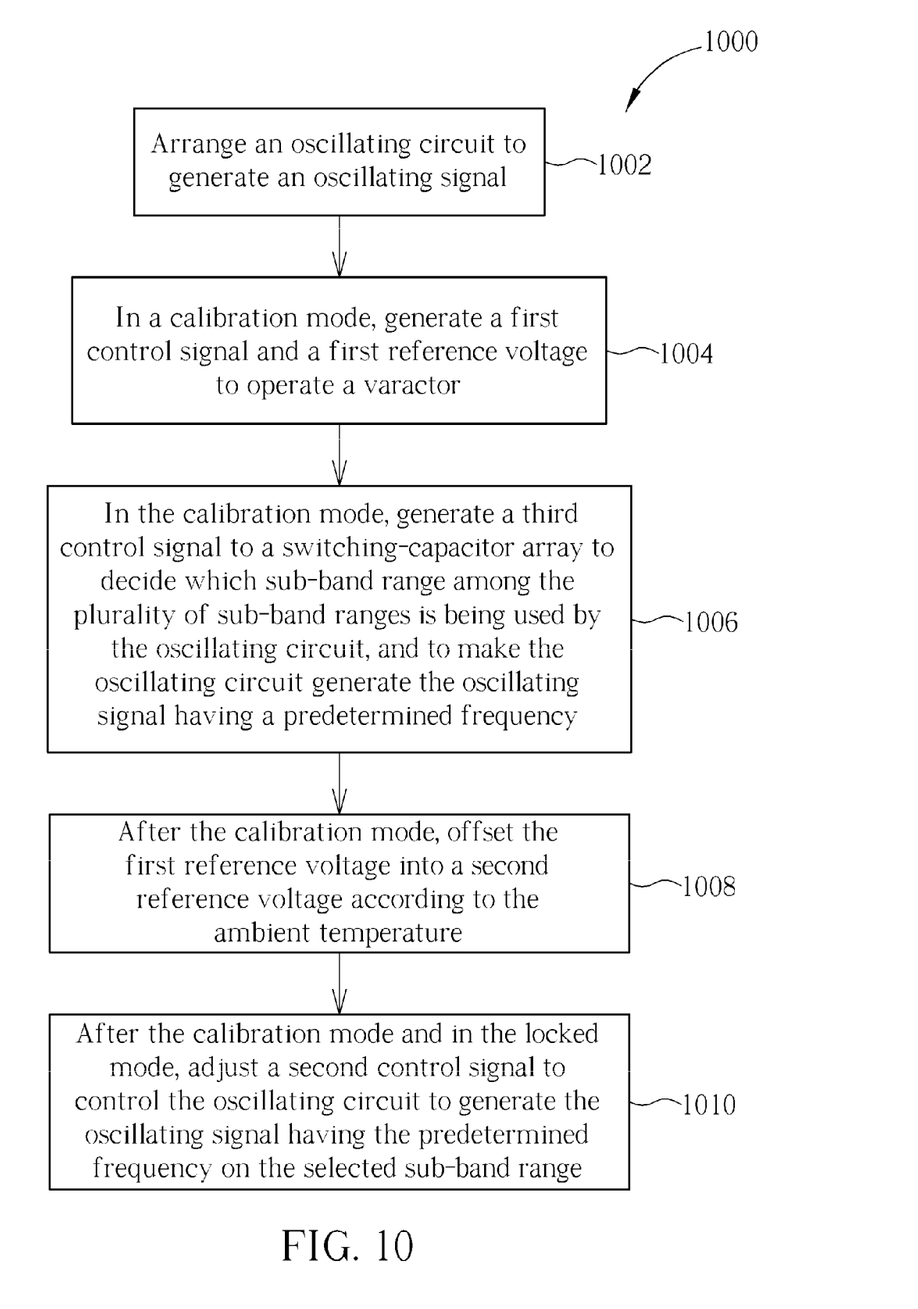
FIG. 10 is a flowchart illustrating a method for controlling an oscillating signal generator utilized in a phase-locked loop according to a sixth embodiment of the present invention.

According to the third exemplary embodiment, the operation of the oscillating signal generator 702 to compensate the effect of the ambient temperature may be briefly illustrated by the steps in FIG. 10. FIG. 10 is a flowchart illustrating a method 1000 for controlling an oscillating signal generator utilized in a phase-locked loop (PLL) circuit according to a sixth embodiment of the present invention. In the following description of this exemplary embodiment, the PLL circuit may refer to the PLL 100, and the oscillating signal generator may refer to the oscillating signal generator 702 for brevity. In addition, provided that substantially the same result is achieved, the steps of the flowchart shown in FIG. 10 need not be in the exact order shown and need not be contiguous, that is, other steps can be intermediate. The method comprises:

Step 1002: Arrange the oscillating circuit 7022 to generate the oscillating signal Sosc;

Step 1004: In the calibration mode, generate the first control signal Sc1" at the terminal Nt3 and the first reference voltage Vr1" at the terminal Nr3 to operate the varactor 7022d, wherein the first control signal Sc1" substantially equals the middle position between the first boundary V1 and the second boundary V2;

Step 1006: In the calibration mode, generate the third control signal Sc3" to the switching-capacitor array 7022c to decide which sub-band range among the plurality of sub-band ranges S[1]-S[N] is being used by the oscillating circuit 7022, and to make the oscillating circuit 7022 generate the oscillating signal Sosc having the predetermined frequency Fp;

Step 1008: After the calibration mode, offset the first reference voltage Vr1" into the second reference voltage Vr2" according to the ambient temperature;

Step 1010: After the calibration mode and in the locked mode, adjust the second control signal Sc2" to control the oscillating circuit 7022 to generate the oscillating signal Sosc having the predetermined frequency Fp on the selected sub-band range (i.e., S[Y]).

Briefly, before the system is utilized for transmitting or receiving the real data, the present embodiment(s) offsets the voltage drop between the varactor in the oscillating circuit and consequently offsets the selected sub-band range of the PLL circuit to compensate the effect of the drift of ambient temperature. By doing this, the tuning voltage of the oscillating circuit may have enough voltage range for the PLL circuit to keep locking on the predetermined frequency when the ambient temperature is changed from the low temperature to the high temperature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillating signal generator utilized in a phase-locked loop (PLL), comprising:
    an oscillating circuit, arranged to generate an oscillating signal according to at least a first control signal; and
    a control circuit, arranged to adjust the first control signal according to a temperature;
wherein the first control signal is tuned between a first boundary and a second boundary, and when the temperature is closer to a first temperature boundary than a second temperature boundary, the control circuit is arranged to make the first control signal to be closer to the first boundary than the second boundary such that the oscillating circuit outputs the oscillating signal of a predetermined frequency in a locked mode of the PLL, and the oscillating circuit comprises:
    a varactor, controlled by the first control signal in the locked mode and controlled by a second control signal in a calibration mode of the PLL; and
    a switching-capacitor array, controlled by a third control signal in the calibration mode and controlled by a fourth control signal in the locked mode.

2. The oscillating signal generator of claim 1, wherein the oscillating circuit is a digitally-controlled oscillator (DCO).

3. The oscillating signal generator of claim 1, wherein both the first boundary and the second boundary are voltage boundaries.

4. The oscillating signal generator of claim 1, wherein the temperature is determined by a thermal sensor arranged to sense an ambient temperature of the oscillating signal generator.

5. The oscillating signal generator of claim 1, wherein the control circuit is further arranged to:
    in the calibration mode, generate the second control signal at a substantially middle position between the first boundary and the second boundary to operate the varactor by the second control signal, and generate the third control signal to make the oscillating circuit generate the oscillating signal having the predetermined frequency, wherein the third control signal represents a first sub-band range; and
    after the calibration mode, operate the switching-capacitor array by the fourth control signal derived from a second sub-band range, which is offset from the first sub-band range, according to the temperature, so as to make the PLL lock the oscillating circuit by controlling the first control signal in the locked mode.

6. The oscillating signal generator of claim 1, wherein after the calibration mode and before the locked mode, the control circuit further adjusts the third control signal into the fourth control signal by a predetermined unit step signal according to the temperature.

7. A method for controlling an oscillating signal generator utilized in a phase-locked loop (PLL), the method comprising:
    arranging an oscillating circuit to generate an oscillating signal according to at least a first control signal, wherein the first control signal is tuned between a first boundary and a second boundary; and
    when a temperature is closer to a first temperature boundary than a second temperature boundary, controlling the first control signal to be closer to the first boundary than the second boundary such that the oscillating circuit outputs the oscillating signal of a predetermined frequency in a locked mode of the PLL;
wherein the oscillating circuit comprises:
    a varactor, controlled by the first control signal in the locked mode and controlled by a second control signal in a calibration mode of the PLL; and
    a switching-capacitor array, controlled by a third control signal in the calibration mode and controlled by a fourth control signal in the locked mode.

8. The method of claim 7, wherein the step of controlling the first control signal comprises:
    in the calibration mode, generating the second control signal at a substantially middle position between the first boundary and the second boundary to operate the varactor by the second control signal, and
    generating the third control signal to make the oscillating circuit generate the oscillating signal having the predetermined frequency, wherein the third control signal represents a first sub-band range; and
    after the calibration mode, operating the switching-capacitor array by the fourth control signal derived from a second sub-band range, which is offset from the first sub-band range according to the temperature, so as to make the PLL lock the oscillating circuit by controlling the first control signal in the locked mode.

9. The method of claim 7, further comprising:
    after the calibration mode and before the locked mode, adjusting the third control signal into the fourth control signal by a predetermined unit step signal according to the temperature.

10. An oscillating signal generator utilized in a phase-locked loop (PLL), comprising:
    an oscillating circuit, arranged to generate an oscillating signal according to at least a first control signal; and
    a control circuit, arranged to adjust the first control signal according to a temperature;
wherein the first control signal is tuned between a first boundary and a second boundary, and when the temperature is closer to a first temperature boundary than a second temperature boundary, the control circuit is arranged to make the first control signal to be closer to the first boundary than the second boundary such that the oscillating circuit outputs the oscillating signal of a predetermined frequency in a locked mode of the PLL, the oscillating circuit comprises
    a varactor, controlled by the first control signal in a calibration mode of the PLL and controlled by a second control signal in the locked mode; and
    a switching-capacitor array, controlled by a third control signal in the locked mode and the calibration mode; and the control circuit is further arranged to:
   in the calibration mode, generate a first reference voltage and the first control signal to operate the varactor, and generate the third control signal to make the oscillating circuit generate the oscillating signal having the predetermined frequency; and
   after the calibration mode, offset the first reference voltage into a second reference voltage to operate the varactor according to the temperature;
   wherein the PLL locks the oscillating circuit by controlling the second control signal in the locked mode.

11. A method for controlling an oscillating signal generator utilized in a phase-locked loop (PLL), the method comprising:
   arranging an oscillating circuit to generate an oscillating signal according to at least a first control signal, wherein the first control signal is tuned between a first boundary and a second boundary; and
   when a temperature is closer to a first temperature boundary than a second temperature boundary, controlling the first control signal to be closer to the first boundary than the second boundary such that the oscillating circuit outputs the oscillating signal of a predetermined frequency in a locked mode of the PLL;
wherein the oscillating circuit comprises:
   a varactor, controlled by the first control signal in a calibration mode of the PLL while controlled by a second control signal in the locked mode; and
   a switching-capacitor array, controlled by a third control signal in the locked mode and the calibration mode; and
the step of controlling the first control signal comprises:
   in the calibration mode, generate a first reference voltage and the first control signal to operate the varactor, and generate the third control signal to make the oscillating circuit generate the oscillating signal having the predetermined frequency; and
   after the calibration mode, offset the first reference voltage into a second reference voltage to operate the varactor according to the temperature;
   wherein the PLL locks the oscillating circuit by controlling the second control signal in the locked mode.

* * * * *